(12) United States Patent
Lee

(10) Patent No.: US 8,969,980 B2
(45) Date of Patent: Mar. 3, 2015

(54) VENTED MEMS APPARATUS AND METHOD OF MANUFACTURE

(71) Applicant: Knowles Electronics, LLC, Itasca, IL (US)

(72) Inventor: Sung Bok Lee, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 2 days.

(21) Appl. No.: 13/623,598

(22) Filed: Sep. 20, 2012

(65) Prior Publication Data

US 2013/0075836 A1    Mar. 28, 2013

Related U.S. Application Data

(60) Provisional application No. 61/538,253, filed on Sep. 23, 2011.

(51) Int. Cl.
| | |
|---|---|
| H01L 29/84 | (2006.01) |
| B81B 7/00 | (2006.01) |
| H04R 19/00 | (2006.01) |
| H04R 19/04 | (2006.01) |

(52) U.S. Cl.
CPC ............ *B81B 7/0029* (2013.01); *H04R 19/005* (2013.01); *H04R 19/04* (2013.01); *H04R 2201/003* (2013.01); *B81B 2201/0257* (2013.01); *B81B 2203/0127* (2013.01)
USPC ........... 257/416; 257/414; 257/415; 257/417; 257/418; 257/419; 257/254; 257/257; 257/678; 257/690

(58) Field of Classification Search
CPC ..... H01L 29/84; H04R 19/04; B81C 1/00158
USPC ............ 257/704, 415, 416; 73/721; 381/174, 381/175
See application file for complete search history.

(56) References Cited

U.S. PATENT DOCUMENTS

| | | | |
|---|---|---|---|
| 5,870,482 A * | 2/1999 | Loeppert et al. | 381/174 |
| 7,373,835 B2 | 5/2008 | Matsubara | |
| 8,472,648 B2 * | 6/2013 | Wang et al. | 381/175 |
| 2006/0006483 A1* | 1/2006 | Lee et al. | 257/415 |
| 2008/0142475 A1 | 6/2008 | Loeppert et al. | |
| 2008/0205673 A1 | 8/2008 | Ehrlund | |

(Continued)

FOREIGN PATENT DOCUMENTS

KR    20110054529    5/2011

OTHER PUBLICATIONS

International Search Report and Written Opinion for related PCT Application No. PCT/US2012/056462, Feb. 26, 2013, 9 pages.

*Primary Examiner* — Thao X Le
*Assistant Examiner* — Long Le
(74) *Attorney, Agent, or Firm* — Fitch, Even, Tabin & Flannery LLP

(57) ABSTRACT

A micro-electromechanical system (MEMS) device includes a housing and a base. The base includes a port opening extending therethrough and the port opening communicates with the external environment. The MEMS die is disposed on the base and over the opening. The MEMS die includes a diaphragm and a back plate and the MEMS die, the base, and the housing form a back volume. At least one vent extends through the MEMS die and not through the diaphragm. The at least one vent communicates with the back volume and the port opening and is configured to allow venting between the back volume and the external environment.

7 Claims, 6 Drawing Sheets

(56) References Cited

U.S. PATENT DOCUMENTS

| | | |
|---|---|---|
| 2009/0001553 A1* | 1/2009 | Pahl et al. .................... 257/704 |
| 2009/0034760 A1* | 2/2009 | Minamio et al. ............. 381/175 |
| 2009/0290741 A1 | 11/2009 | Daley et al. |
| 2010/0284553 A1* | 11/2010 | Conti et al. ................... 381/174 |
| 2011/0036174 A1* | 2/2011 | Hooper et al. .................. 73/721 |
| 2011/0204745 A1* | 8/2011 | Omura et al. ................. 310/300 |
| 2011/0272769 A1 | 11/2011 | Song et al. |

\* cited by examiner

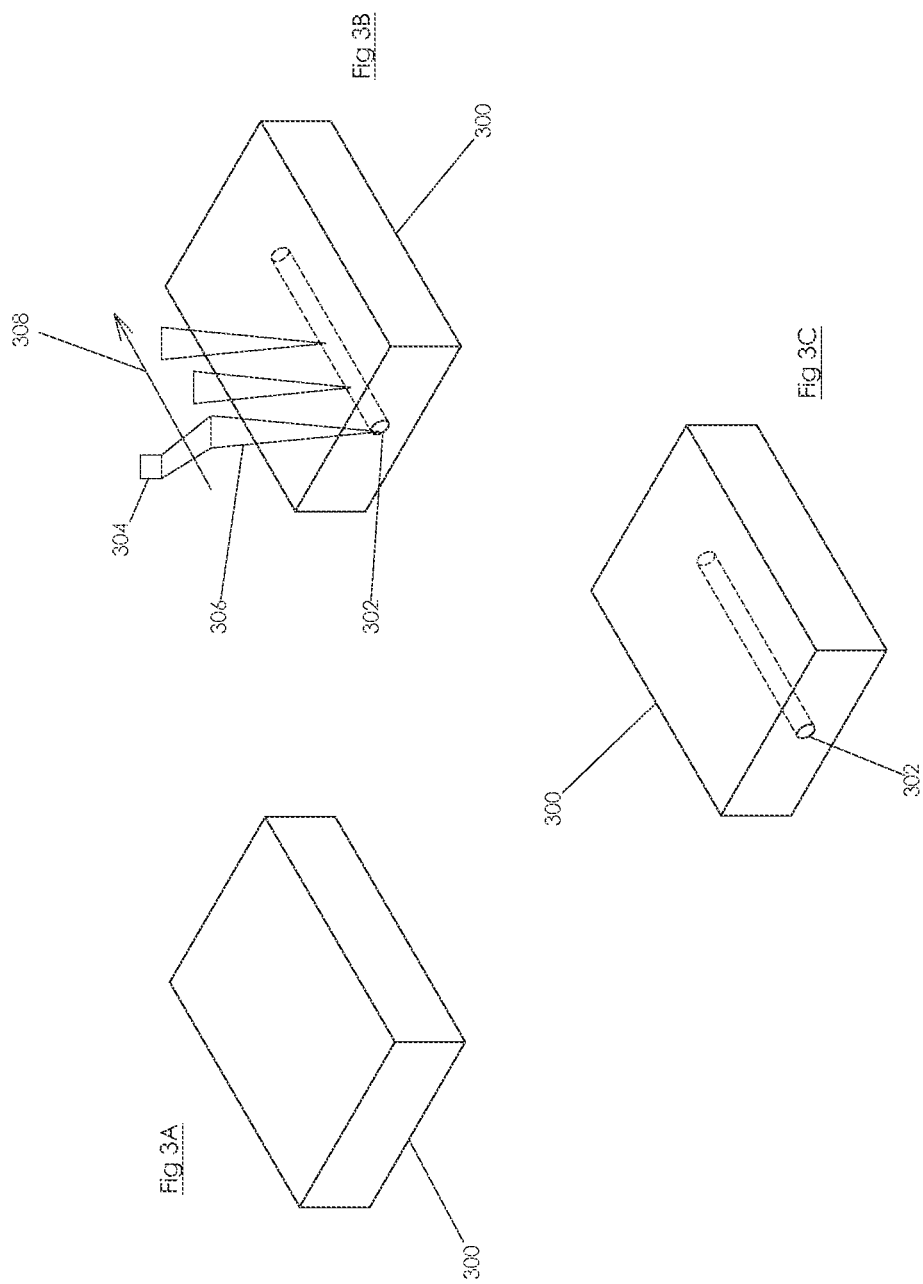

US 8,969,980 B2

VENTED MEMS APPARATUS AND METHOD OF MANUFACTURE

CROSS REFERENCE TO RELATED APPLICATIONS

This patent claims benefit under 35 U.S.C. §119 (e) to U.S. Provisional Application No. 61/538,253 entitled "Vented MEMS Apparatus And Method Of Manufacture" filed Sep. 23, 2011, the content of which is incorporated herein by reference in its entirety.

TECHNICAL FIELD

This application relates to acoustic devices and, more specifically, to approaches for venting these devices.

BACKGROUND OF THE INVENTION

Various types of microphones and receivers have been used through the years. In these devices, different electrical components are housed together within a housing or assembly. For example, a microphone may include a micro-electromechanical system (MEMS) device with a diaphragm, and integrated circuits, among other components and these components are disposed within the housing. Other types of acoustic devices may include other types of components. These devices may be used in hearing instruments such as hearing aids or in other electronic devices such as cellular phones and computers.

Microphones typically use a diaphragm and the diaphragm is often placed in the vicinity of an electrical conductive plate. As is known, as sound pressure moves the diaphragm, the conductive plate's charge is thereby varied to responsively produce an electric current and this current represents the sound energy. The area between the diaphragm and the plate is a high electric field area (e.g., approximately 11V/3 micro meters or approximately $4*10^6$ V/m or 40 kV/cm).

Venting holes are often formed through the diaphragm. These venting holes serve various purposes. In one example, the venting holes are environmental vents that provide for pressure equalization for the device.

Although the venting holes on the diaphragm offer some advantages, the holes also create a pathway for particles and condensable vapor to enter the high field area from the exterior of the microphone. If the particles or vapor are successful in entering this high field area, then the device may not operate properly.

BRIEF DESCRIPTION OF THE DRAWINGS

For a more complete understanding of the disclosure, reference should be made to the following detailed description and accompanying drawings wherein:

FIGS. 3A-3C are perspective views of a manufacturing process for constructing the side vent according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are provided whereby MEMS die includes a side vent that provides for environmental venting instead of a vent through the diaphragm. The side vent or vents are not in and do not extend through the diaphragm but instead extend through the MEMS die (e.g., to vent the back volume). In so doing, the ability of particles to pass through the diaphragm to sensitive areas of a device is eliminated. The approaches described herein result in increased user satisfaction with the devices.

The approaches provided herein create vents that are away from the sensitive area around the back plate. Additionally, a plurality of holes can be created. Moreover, customers using these devices need take no additional steps to implement the approaches described herein.

A micro-electromechanical system (MEMS) device includes a housing and a base. The base includes a port opening extending therethrough and the port opening communicates with the external environment. The MEMS die is disposed on the base and over the opening. The MEMS die includes a diaphragm and a back plate and the MEMS die, the base, and the housing form a back volume. At least one vent extends through the MEMS die and not through the diaphragm. At least one vent communicates with the back volume and the port opening and is configured to allow venting between the back volume and the external environment.

In other aspects, a sensitive area is formed between the diaphragm and the back plate. The lack of vent in the diaphragm prevents contaminants from entering the sensitive area.

In still other aspects, the at least one vent is approximately circular in cross sectional shape. In still other examples, the at least one vent is slot-shaped in cross sectional shape.

In other aspects, the MEMS device includes a processing device coupled to the MEMS die. In some examples, the processing device is an integrated circuit. Although various dimensions can be selected for the vent, in one example the vent is approximately 40 microns in diameter.

Figure 1:
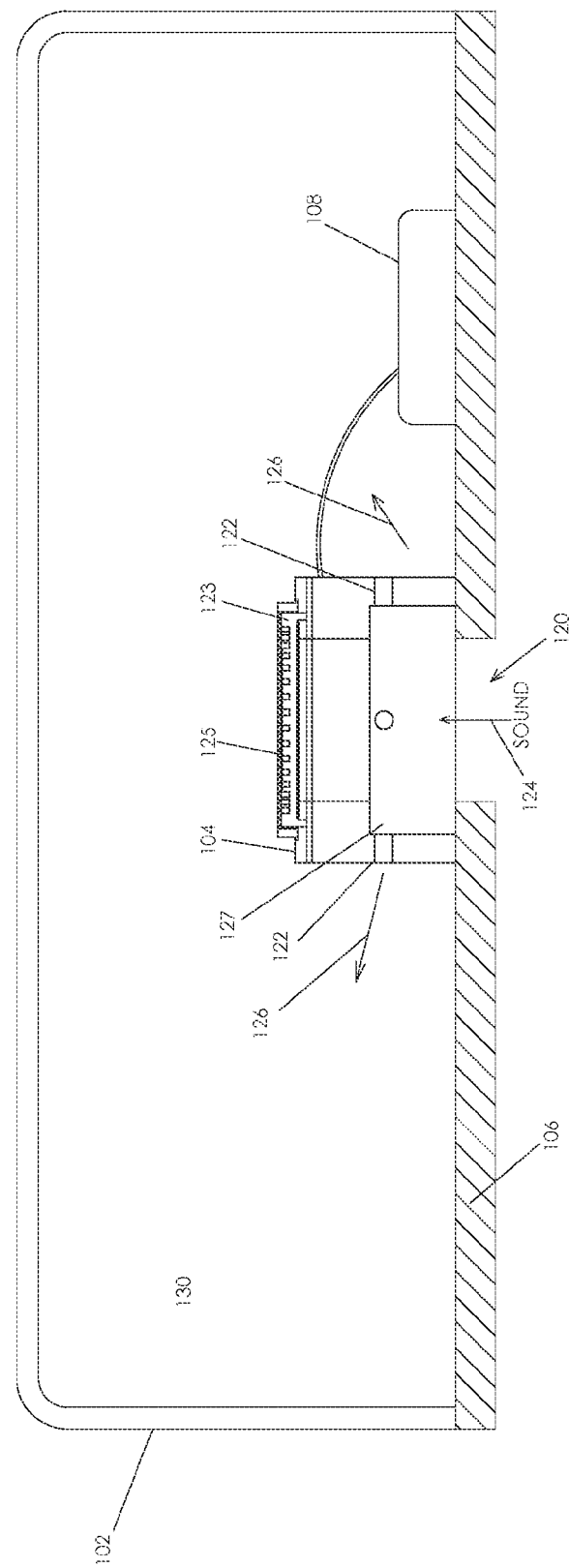
FIG. 1 is a block diagram of a MEMS microphone system with side vent according to various embodiments of the present invention.
Figure 2A:
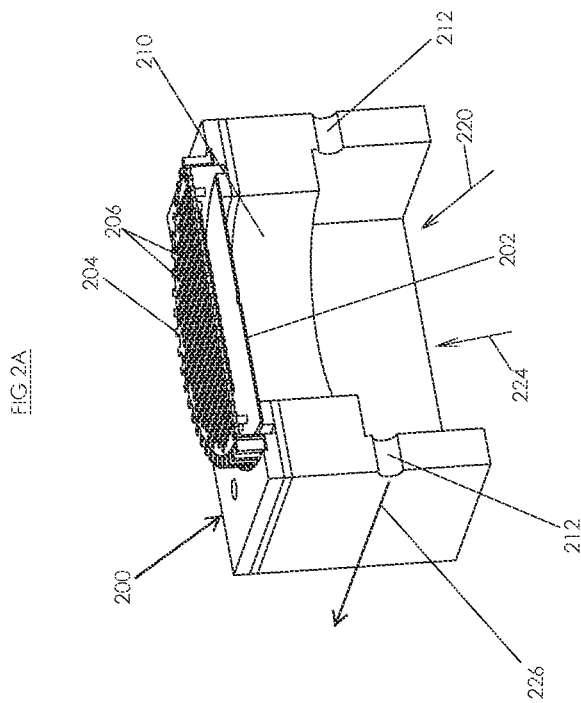
FIGS. 2A-D are various perspective views of a MEMS die with the side vent being a hole according to various embodiments of the present invention.
Figure 2B:
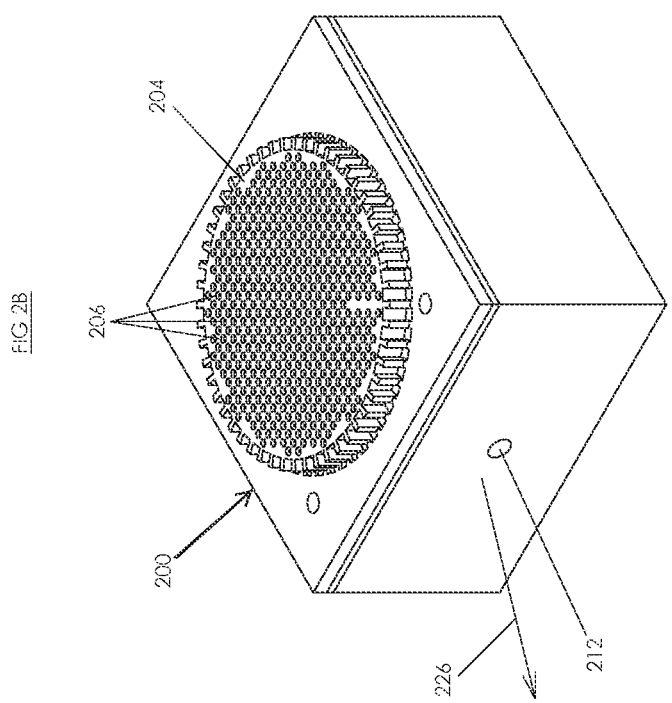
Figure 2C:
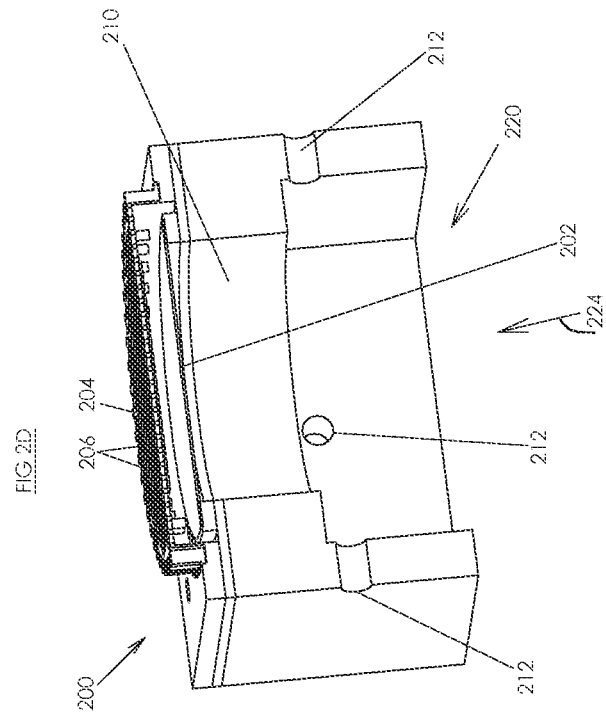
Figure 2D:
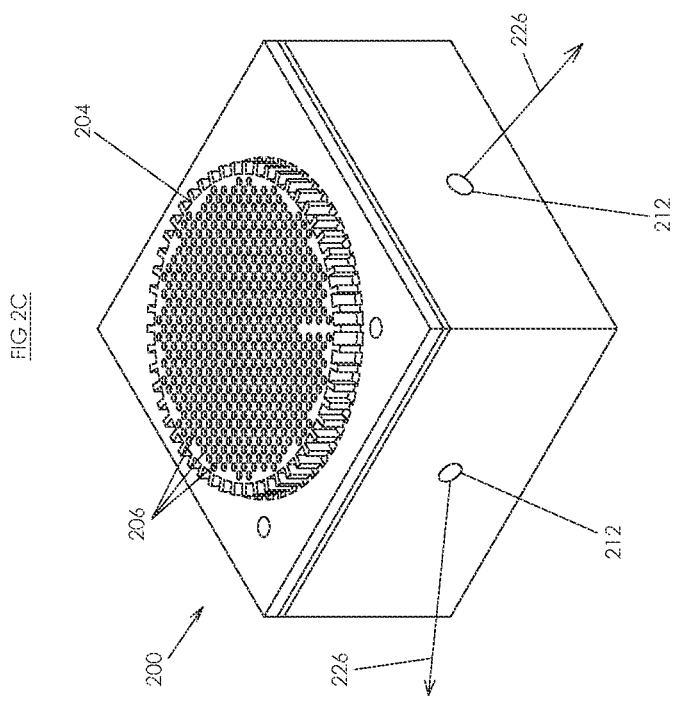
Figure 2E:
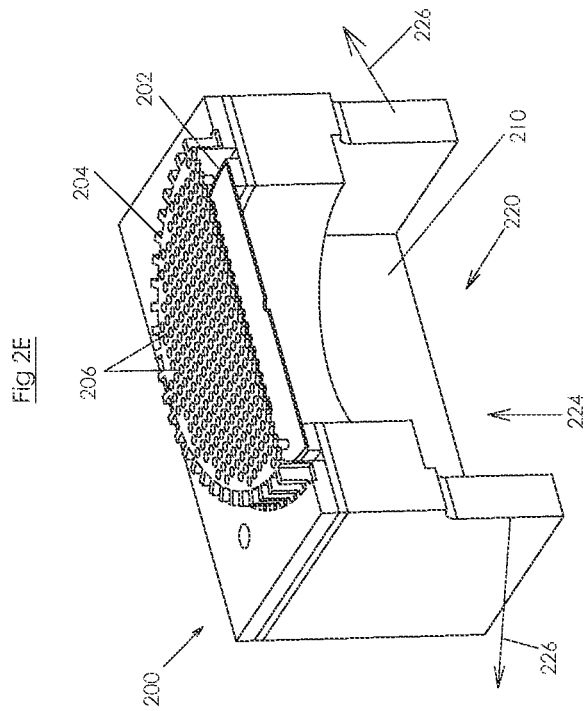
FIGS. 2E-H are various perspective views of another MEMS die with the side vents being a slot according to various embodiments of the present invention.
Figure 2F:
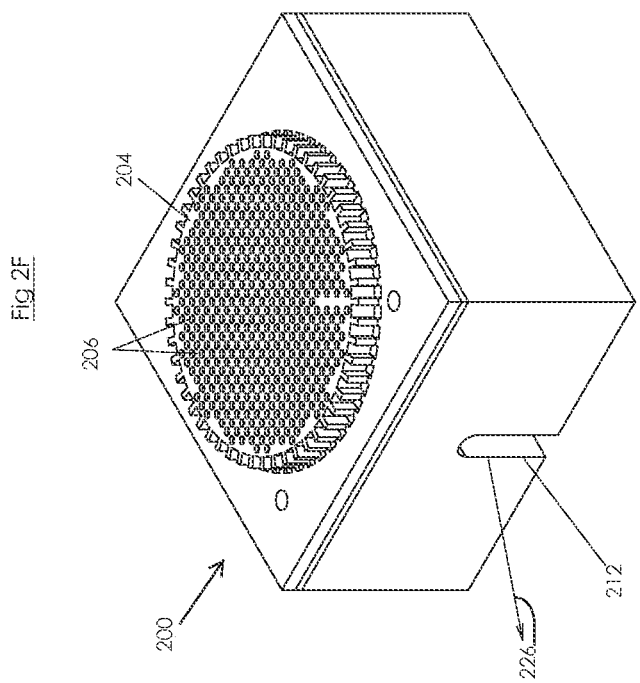
Figure 2H:
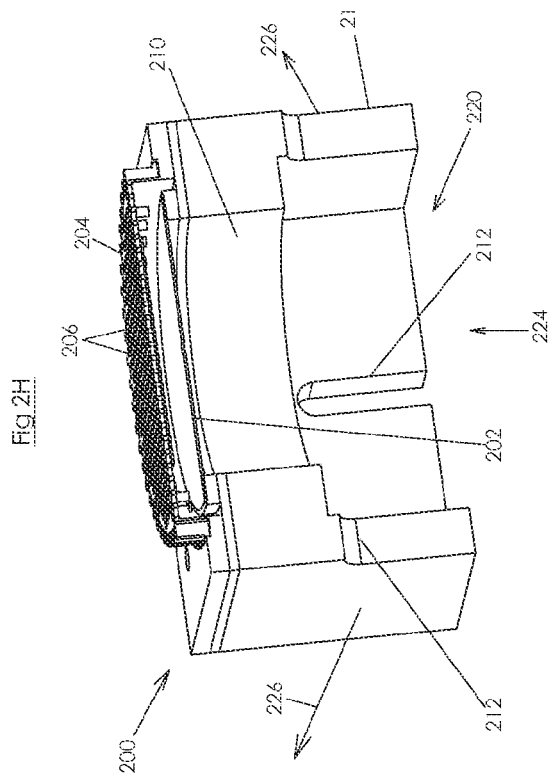
Figure 2G:
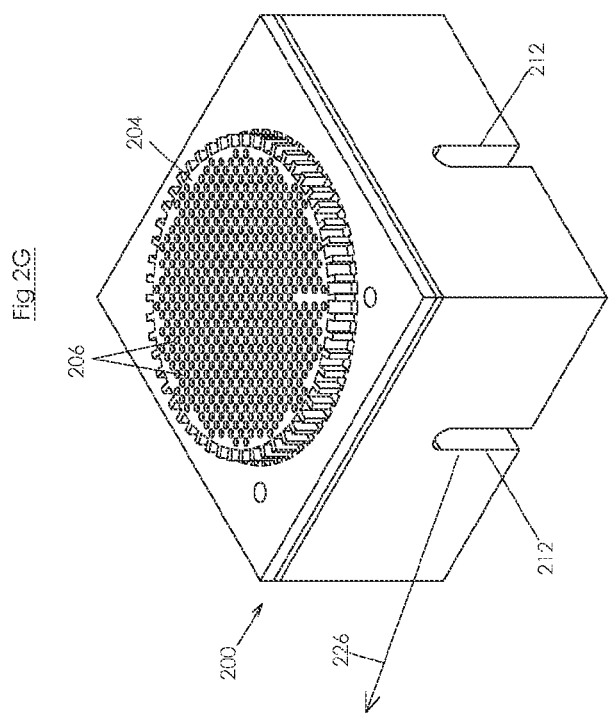

Referring now to FIG. 1, a MEMS microphone apparatus 100 is described. The apparatus 100 includes a housing 102, a MEMS die 104, a base 106, and a processing device 108. The housing 102 may be constructed of any suitable material such as a metal. The MEMS die 104 (which will be described in greater detail with respect to FIG. 2 below), a port 120, a diaphragm 123, a charged back plate 125, venting holes 122, and back volume 130. As will be explained in greater detail below, the venting holes 122 provide for environmental venting. As used herein, "environmental venting" means one or more air or sound path between the outside environment of the microphone apparatus and the back volume. Here, outside environment also includes the front volume 127. The resistance of this path to air or sound flow along with the magnitude of the back volume determines low frequency roll-off point. The processing device 108 may be a variety of different processing devices and in one aspect may be an electronic integrated circuit that provides amplification functions for the signal obtained by the MEMS device 104.

In operation, sound (indicated by the arrow labeled 124) enters the MEMS device 104 via a port 120. The port 120 extends through the housing and into the MEMS device 104. The sound 124 moves the diaphragm 123, which in turn alters the charge on the back plate 125 to create an electrical current or voltage representative of the sound. The electrical current or voltage is transmitted to the device 108 for further processing. Venting occurs in the direction indicated by the arrows labeled 126 via the venting holes 122. In one example, the holes 122 are approximately 40 micrometers in diameter. Other dimensions are possible. It will be appreciated that although the venting holes 122 described with respect to FIG. 1 are circular or approximately circular, they can have any regular or irregular cross-sectional shape such as elliptical, square, or any irregular cross-sectional shape.

It will be appreciated that the side vent or vents 122 are not in and do not extend through the diaphragm 123 but instead extend through the MEMS die 104 (e.g., to vent the back volume 130). In so doing, the ability of particles to pass through the diaphragm 123 to sensitive areas of a device (e.g., the area between the diaphragm 123 and the back plate 125) is eliminated.

Referring now to FIGS. 2A-D, another example of a MEMS die 200 according with a side vent is described. The MEMS die 200 includes a diaphragm 202, a charged back plate 204 including vents 206, a front volume 210, and side vents 212. The side vents 212 extend through the MEMS die 200.

In operation, sound (indicated by the arrow labeled 224) enters the MEMS die 200 via port 220 (connected to port 120 of FIG. 1). The sound moves the diaphragm 202, which in turn alters the charge on the charge plate 204 to create an electrical current or voltage signal representative of the sound. The electrical signal is sent to an external device (e.g., the external device 108 of FIG. 1) for further processing. Venting occurs in the direction indicated by the arrows labeled 226 via holes 212. In one example, the holes 212 are approximately 40 microns in diameter. Other dimensions are possible. It will be appreciated that although the venting holes described with respect to FIGS. 2A-D are circular or approximately circular, they can have any regular or irregular cross-sectional shape such as elliptical, square, or any irregular cross-sectional shape.

It will be appreciated that the side vent or vents 212 are not in and do not extend through the diaphragm 202 but instead extend through the MEMS die 200 (e.g., to vent the area of the front volume 210). In so doing, the ability of particles to pass through the diaphragm to sensitive areas of a device (e.g., the area 208 between the charge plate 204 and the diaphragm 202) is eliminated.

Referring now to FIGS. 2E-H another example of a MEMS die 200 according with a side vent is described. In this example, the side vents 212 are slot-shaped rather than shaped as holes (as in FIGS. 2A-D). All other components are the same and operate similarly to the example of FIGS. 2A-D. Consequently, the description of these components and their operation will not be described further.

Referring now to FIGS. 3A-3C, one example of a manufacturing process is described. The process can be the same as used in U.S. Published Application No. 20080142475, which is incorporated herein by reference in its entirety. However, other types of processes or approaches may also be used.

As shown in FIG. 3A, a piece of silicon is obtained. For example, a piece of silicon 300 having dimensions of the MEMS die may be obtained. As shown in FIG. 3B, a laser dicing pass (employing lasers 304 firing focused laser beams 306 moving in the direction indicated by the arrow labeled 308) is used to create a line of modified silicon 302 within the silicon 300. Other lines of modified silicon may also be created in the silicon 300. As shown in FIG. 3C, after finishing the process, the silicon 300 is placed in a caustic solution (e.g., KOH or TMAH). After placement in the solution, the modified region 302 quickly etches away leaving a hole or holes through the silicon. The silicon 300 can be further processed/cut to form the MEMS device, such that the vents are side vents, for example, the side vents as shown in the devices of FIG. 1 and FIG. 2. Further, the remaining elements of a microphone device (e.g., the housing, diaphragm, and processing chips) may also be assembled together.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A micro-electromechanical system (MEMS) device, comprising:
    a housing;
    a base with a port opening extending therethrough, wherein the port opening communicates with the external environment;
    a MEMS die disposed on the base and over the opening, the MEMS die securing a diaphragm and a back plate, wherein the MEMS die, the base, and the housing form a back volume;
    wherein a longitudinal axis extends longitudinally through a center of the MEMS die, the diaphragm, the back plate, and the port opening;
    at least one vent extending through the MEMS die and not through the diaphragm or the back plate, the at least one vent being a passageway with a first end and a second end, the passageway being surrounded on at least three sides by the MEMS die and opening at the first end and the second end, the at least one vent extending in a generally outward and radial direction from the longitudinal axis, the at least one vent communicating with the back volume and the port opening, the at least one vent being configured to allow venting between the back volume and the external environment, the venting being effective to equalize pressure between the back volume and the outside environment wherein the first end opens to the back volume and the second end opens to the outside environment.

2. The MEMS device of claim 1 wherein a sensitive area is formed between the diaphragm and the back plate and wherein the lack of vent in the diaphragm prevents contaminants from entering the sensitive area.

3. The MEMS device of claim 1 wherein the at least one vent is approximately circular in cross sectional shape.

4. The MEMS device of claim 1 wherein the at least one vent is slot-shaped in cross sectional shape.

5. The MEMS device of claim 1 further comprising a processing device coupled to the MEMS die.

6. The MEMS device of claim 4 wherein the processing device comprises an integrated circuit.

7. The MEMS device of claim 1 wherein the at least one vent is approximately 40 microns in diameter.

* * * * *